United States Patent [19]
Gibson et al.

[11] Patent Number: 5,512,841
[45] Date of Patent: Apr. 30, 1996

[54] PEAK CURRENT DETECTION IN A TEST INSTRUMENT FOR ENSURING VALIDITY OF COMPONENT TEST OUTPUT

[75] Inventors: Robert T. Gibson, Snohomish; Paul H. Heydron, Lynnwood, both of Wash.

[73] Assignee: Fluke Corporation, Everett, Wash.

[21] Appl. No.: 306,550

[22] Filed: Sep. 15, 1994

[51] Int. Cl.$^6$ .............................. G01R 1/06; G01R 13/20
[52] U.S. Cl. ........................................ 324/756; 324/121 R
[58] Field of Search ........................... 324/76.52, 76.77, 324/111, 121 R, 756; 364/483, 487

[56] References Cited

U.S. PATENT DOCUMENTS

| | | | |
|---|---|---|---|
| 4,041,254 | 8/1977 | Bradley et al. | 324/121 R |
| 4,386,317 | 5/1983 | Clinton | 324/158 |
| 4,773,022 | 9/1988 | Melville et al. | 364/487 |
| 4,965,516 | 10/1990 | Parshotam et al. | 324/158 |
| 5,180,971 | 1/1993 | Montijo | 324/121 R |
| 5,397,981 | 3/1995 | Wiggers | 324/121 R |

*Primary Examiner*—Ernest F. Karlsen
*Assistant Examiner*—Russell M. Kobert
*Attorney, Agent, or Firm*—Marger, Johnson, McCollom & Stolowitz

[57] ABSTRACT

Methods and apparatus are disclosed for using current detection in a test instrument to ensure validity of component test output. In a component test instrument that employs digital synthesis of a test stimulus waveform, voltage scan data and current scan data are successively acquired, the scan data being synchronized relative to the test stimulus waveform. The voltage and current scan data are stored in respective temporary storage buffers. Before displaying the data, a check for an open lead is conducted in a manner similar to a current scan. A zero current value indicates an open lead and the acquired scan data is disqualified from being displayed. Similarly, at the beginning of a component test operation, an open lead test is performed and the first voltage scan is deferred until a validity check confirms that the test leads or probes are in place. The disclosed methods and apparatus ensure that only valid data is displayed to the user.

10 Claims, 4 Drawing Sheets

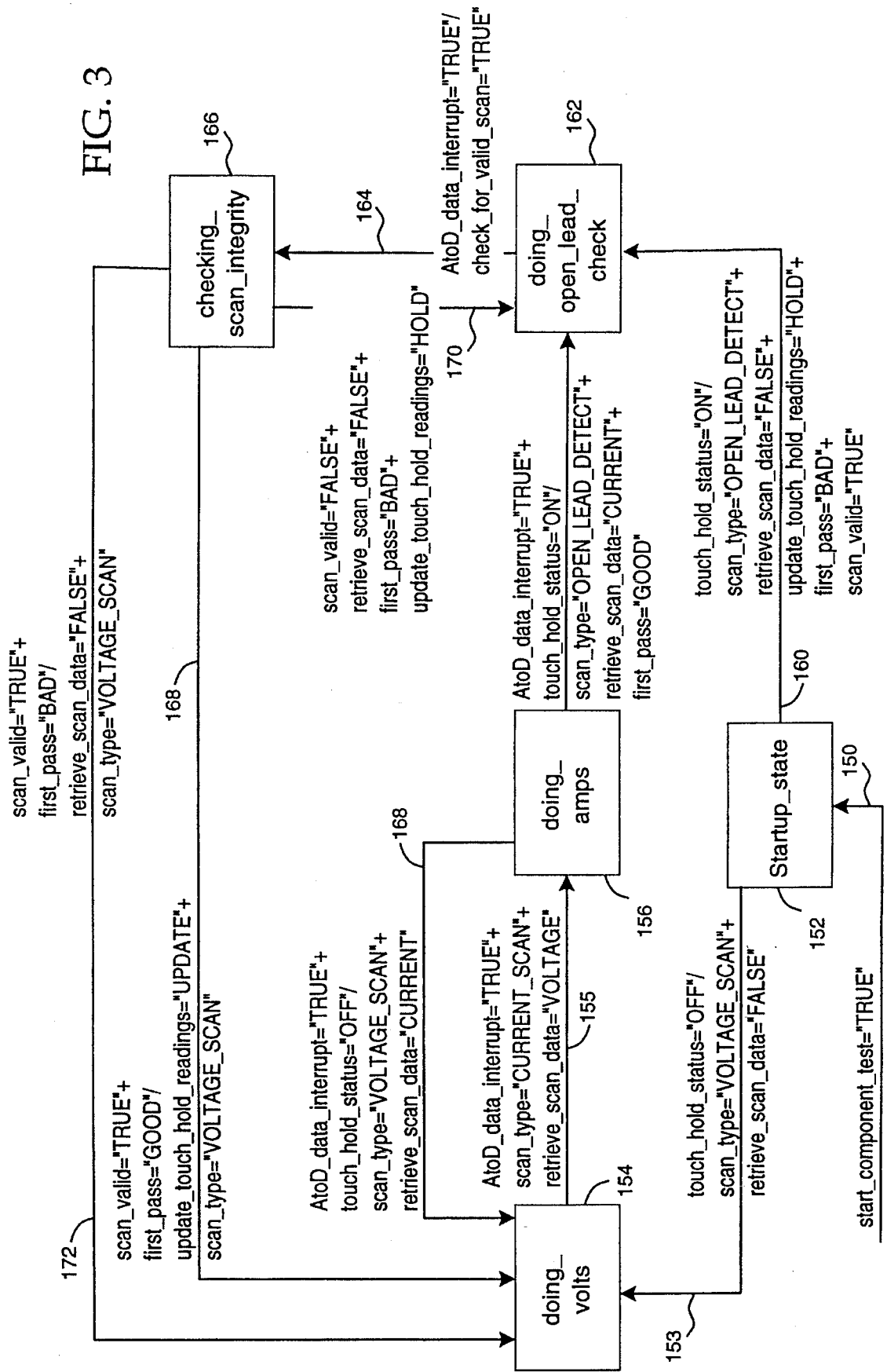

PEAK CURRENT DETECTION IN A TEST INSTRUMENT FOR ENSURING VALIDITY OF COMPONENT TEST OUTPUT

RELATED APPLICATION DATA

This application is related to commonly-assigned U.S. application Ser. No. 08/306549, filed simultaneously herewith and entitled "Graphical Trend Display Methods and Apparatus in a Test Instrument".

BACKGROUND OF THE INVENTION

1. Field of the Invention

The present invention relates to testing electronic components such as discrete, analog components, and more specifically, is directed to methods and apparatus for acquiring and graphically displaying component test data, and for ensuring validity of the displayed data.

2. Background

In the prior art, measuring current-voltage (I–V) characteristics of a component requires the voltage across the device under test (DUT) and the current through the DUT for each point in time. To do so, both current and voltage traditionally are measured simultaneously as a stimulus signal is applied to the DUT.

An improved component test method and apparatus for implementing the method are disclosed in commonly-assigned U.S. patent application entitled "Direct Digital Synthesis Component Test," Ser. No. 08/289,752, filed Aug. 11, 1994. According to that application, separate voltage and current scans are triggered at the same point in time and phase relative to a periodic start time. The start time preferably is the beginning of a cycle of a digitally synthesized test stimulus signal. Said patent application is incorporated herein by this reference.

When a test instrument of the type disclosed in the aforementioned application is switched to a component test mode of operation, a measurement scan, e.g. a voltage scan, begins immediately. Measurement data is acquired and stored beginning on the next trigger point. However, if a probe is applied during the scan, the acquired scan data, and hence the resulting visual display, will be inaccurate. This problem appears if the probes are placed during either the voltage or the current scan.

Another problem can arise upon entering component test mode. Assume that a test instrument is switched to the component test mode and a "Hold" function is enabled. The instrument would "hold" an invalid state (open circuit) if the probes are applied after the instrument is switched to component test. There would be no valid data to display, but the invalid display would be "held".

A further problem related to entering component test mode is time delay before valid component test data is available for display. In a test instrument that digitally synthesizes a test stimulus waveform, the stimulus frequency can be very low or near DC, e.g. 2 Hz. Accordingly, it can take at least several seconds before valid scan data are acquired and displayed. In the meantime, a user may be unsure whether the instrument is operating properly; or, the user may incorrectly infer from an invalid display that the device under test (DUT) is defective. Accordingly, there is a need to defer displaying component test data until such data is known to be valid.

Another problem arises if a user removes a probe during a component test scan. Again, the data acquired during that scan will be invalid. And, if a graphic display of component test data is in use, e.g. a Lissajous pattern, the resulting pattern is likely to be dramatically distorted and perhaps unrecognizable. Such a result is disconcerting to the user and may be misinterpreted as an indication of a failure in the test instrument.

A related problem is illustrated by first assuming that the test instrument is operating with a "Hold" function enabled. A user places the probes on the DUT long enough to recognize the component as present, to do a voltage scan, and to start a current scan. Then the user removes the probe from the component, thereby interrupting the current scan. Actually, the current scan will be completed in any event but the most recent current measurement values will be zero. Again, the resulting graphic display will be distorted and misleading. The need remains therefore to acquire and display component test data that are accurate and logical, both when entering and throughout component test operations.

SUMMARY OF THE INVENTION

In view of the foregoing background, a principal object of the invention is to ensure that only valid data is displayed during a component test mode of operation of a test instrument while the Hold function is enabled.

Another object of the invention is to distinguish between valid component test scan data and data which is suspect because a probe may have been removed during the corresponding measurement scan.

A further object of the invention is to detect when probes have been applied to a component for component test, and to display only valid data acquired after the probes were applied.

Another object of the invention is to detect whether a probe was removed during a component test operation; and to display only valid data known to have been acquired before the probe was removed.

A further object is to avoid user confusion upon entering a component test mode by ensuring that inaccurate information is not displayed initially; and by acquiring and displaying valid test data with minimal delay.

A test periodic stimulus waveform is synthesized digitally, and a trigger signal is provided by the synthesis circuitry to provide a predetermined trigger point relative to the start of each cycle of the stimulus waveform. This trigger signal is used to start acquisition of voltage scan data. After the first scan is completed (and the data stored), the same trigger signal is used to retrigger acquisition of current scan data. The current scan therefore begins at the same point relative to the start of a later cycle of the stimulus waveform. The acquired data forms a data scan pair.

A component test method according to the present invention calls for performing a second current scan, also called a validity scan, after a data scan pair is acquired. The second current scan is performed to determine whether the probes are in place. If current flows during at least a portion of the validity scan, it is assumed that the probes were attached when the voltage and current measurements were taken. Accordingly, the stored scan data is made available for display. If the validity scan detects an open circuit, the stored scan data is suspect and is not processed further.

An alternative aspect of the inventive method calls for repeating the validity current scan process if an open circuit is detected, and continuing to repeat the process (looping) until the readings indicate that the probes were not open during a most recent scan. Once that is true, the method proceeds with the steps of scanning voltage and storing acquired data; scanning current and storing acquired data; and then repeating the validity scan process again. This method has the advantage of solving both the problems of entering the component test mode, and the problem of a probe being removed (or inadvertently falling off) during the component test operation. A further advantage of this method is that the open lead determination, i.e. the process of repeated validity current scanning while a lead is open, need not store any data—just process the data as received. Accordingly, this feature does not require significant additional memory.

Another alternative aspect of the invention is a method that includes the steps of alternately conducting voltage and current scans, storing two voltage and current scan data pairs in memory, and using the last current scan to determine whether the first scan pair did not have open leads at the end of the scan. If that was so, then sending the data for display and reading another scan data pair, using the current scan for open lead determination. This method has the advantage of minimizing time between updates of the display while probes are attached (closed circuit), albeit at the expense of additional memory and a longer delay before first display.

According to the invention, scan data is stored in a temporary location until it is verified as being valid. Only valid data is made available to the display process while Hold is enabled. However, separate hardware registers are not required for temporary storage. Rather, in the preferred embodiment, software buffers are implemented in system RAM, and address pointers are used to identify and access data, or overwrite invalid data, as appropriate.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 3 is a software state transition diagram illustrating a component test method of operation according to the invention.

DETAILED DESCRIPTION OF THE PREFERRED EMBODIMENT

I. DATA FLOW OVERVIEW

Figure 1:
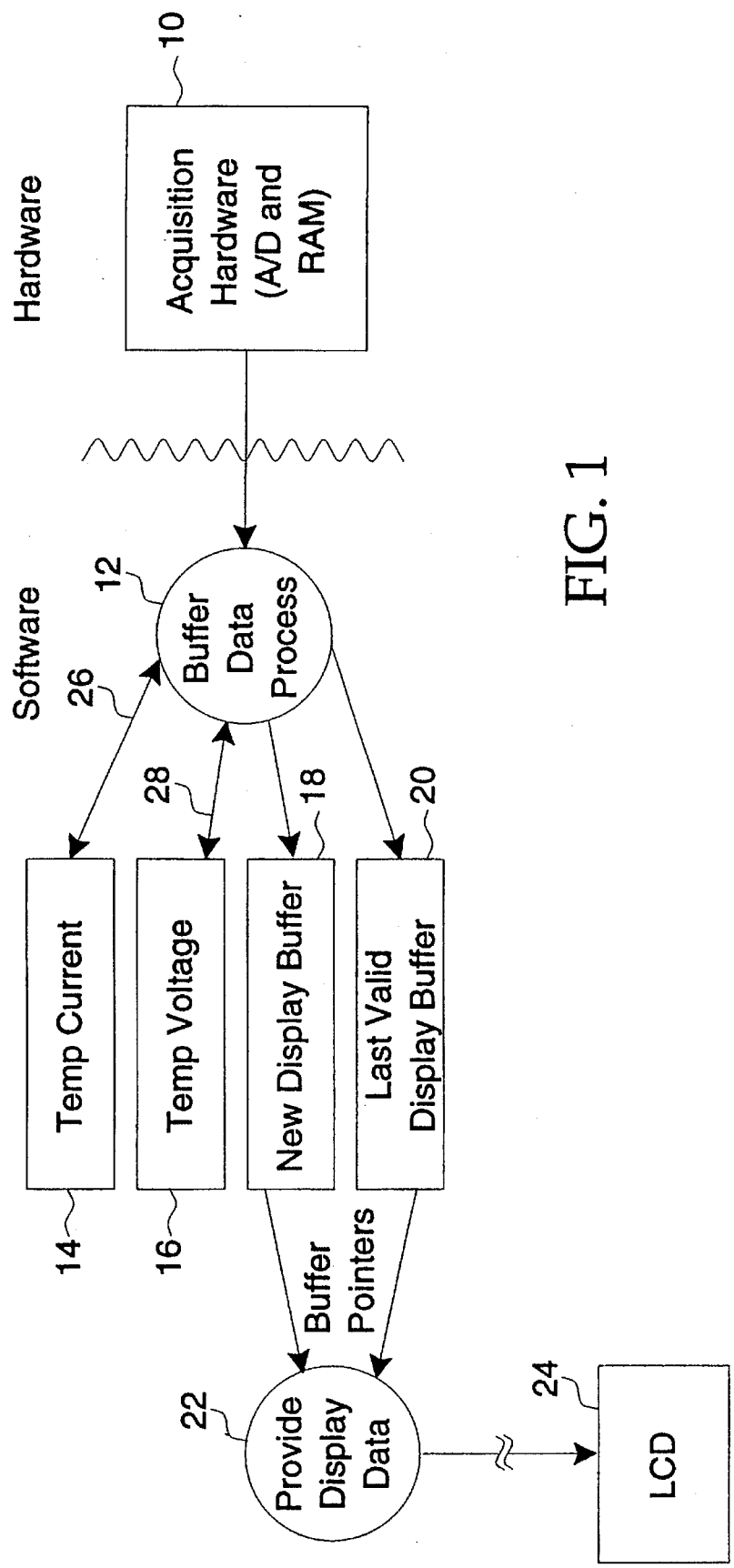
FIG. 1 is a simplified block diagram generally illustrating data flow for display of valid component test data according to the present invention.

FIG. 1 is a simplified block diagram generally illustrating data flow for displaying valid component test data according to the present invention. In FIG. 1, acquisition hardware 10 includes apparatus for taking voltage and current measurements, converting the measurement data to digital form and storing acquired measurement data in an acquisition RAM. The acquisition hardware is described in detail below with reference to FIGS. 2A–2B. The test instrument of the presently preferred embodiment also includes system software, operation of which is described in detail below with reference to FIG. 3. Hardware for storing and executing the system software is described with reference to FIG. 2B.

Referring now to FIG. 1, system software includes buffer data processes 12 which have access to acquisition data stored in the hardware RAM. The buffer data process 12 is arranged for moving acquired current measurement data from the acquisition RAM into a temporary current buffer 14. Similarly, process 12 can selectively move voltage measurement data from the acquisition RAM into a temporary voltage buffer 16.

When the Hold function is enabled, as further explained later, process 12 also moves scan data from buffers 14, 16 to New Display Buffers 18 and to Last Valid Display Buffers 20. Each of buffers 18 and 20 includes means for storing both voltage and current scan data.

When the Hold function is off, process 12 moves acquired voltage and current scan data from the acquisition RAM 10 into temporary buffers 14,16 and into New Display Buffers 18 as further explained below. In general (while Hold is OFF), buffer 18 holds data available for display. Thus, data stored in buffer 18 is made available to a "Provide Display Data" process 22 which accesses the data and provides it to display module 24. In the preferred embodiment, data is not literally moved from the temp buffers into the new display buffer. Rather, when display process 22 requests data, it receives a pointer into the most recent data. At that time, pointers into the temp buffers are swapped with pointers into the new display buffer so that new temp data can be stored without necessarily changing the display.

The buffers 14, 16, 18 and 20 could be implemented as hardware registers. In the preferred embodiment, all of these buffers are implemented in the system memory SRAM 134 (FIG. 2B). Again, scan data is not actually moved by the buffer data process 12 in the sense of relocating the data in memory. Rather, the buffer data process 12 maintains a series of buffer pointers which are used for indicating and accessing selected data as appropriate. Details of implementing circular buffers and buffer pointers will be apparent to those of ordinary skill in the art in view of this disclosure.

II. HARDWARE DESCRIPTION

Figure 2A:
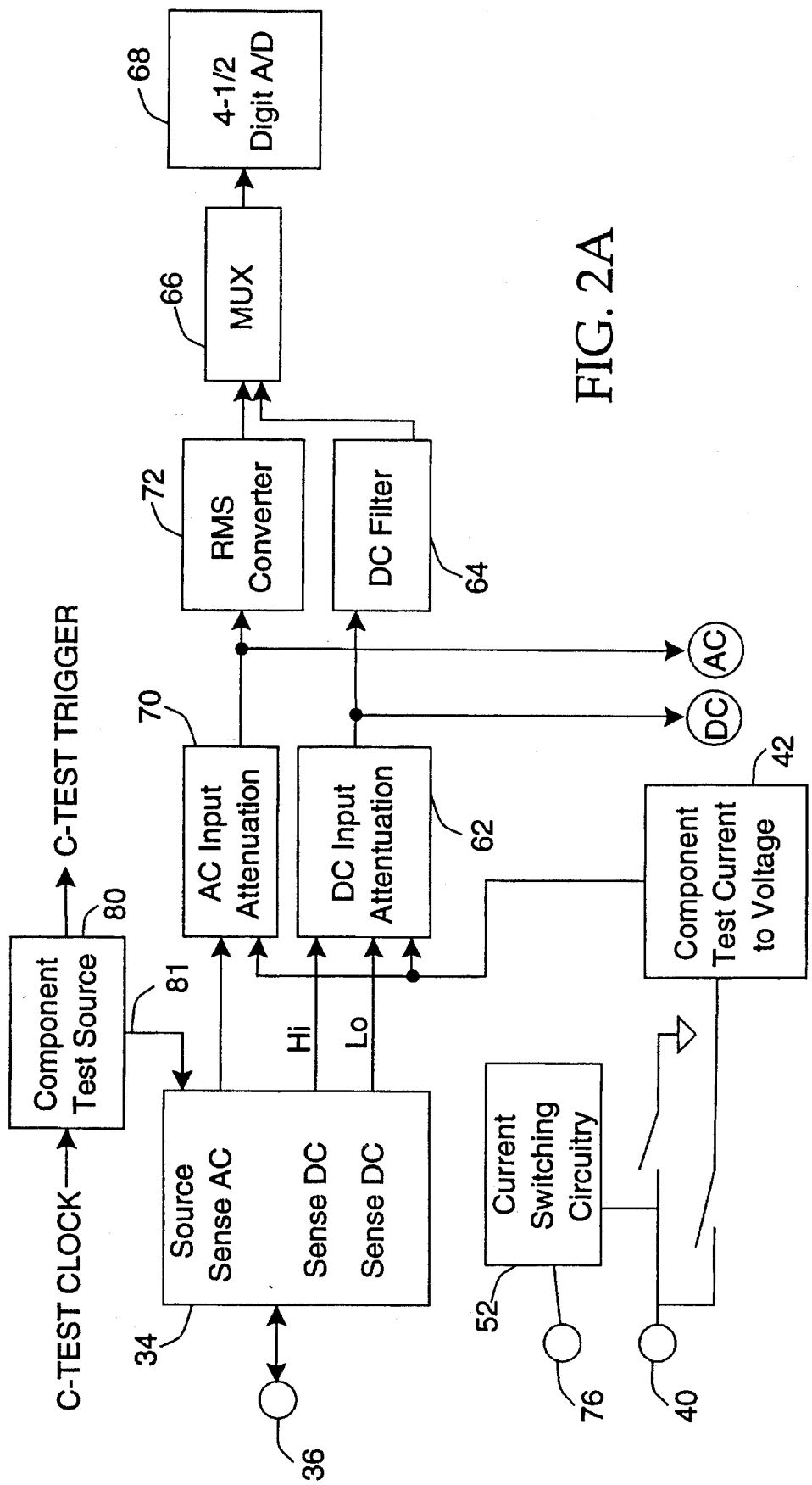
FIGS. 2A and 2B form a simplified block diagram of a test instrument that embodies various aspects of the present invention in the currently preferred embodiment.
Figure 2B:
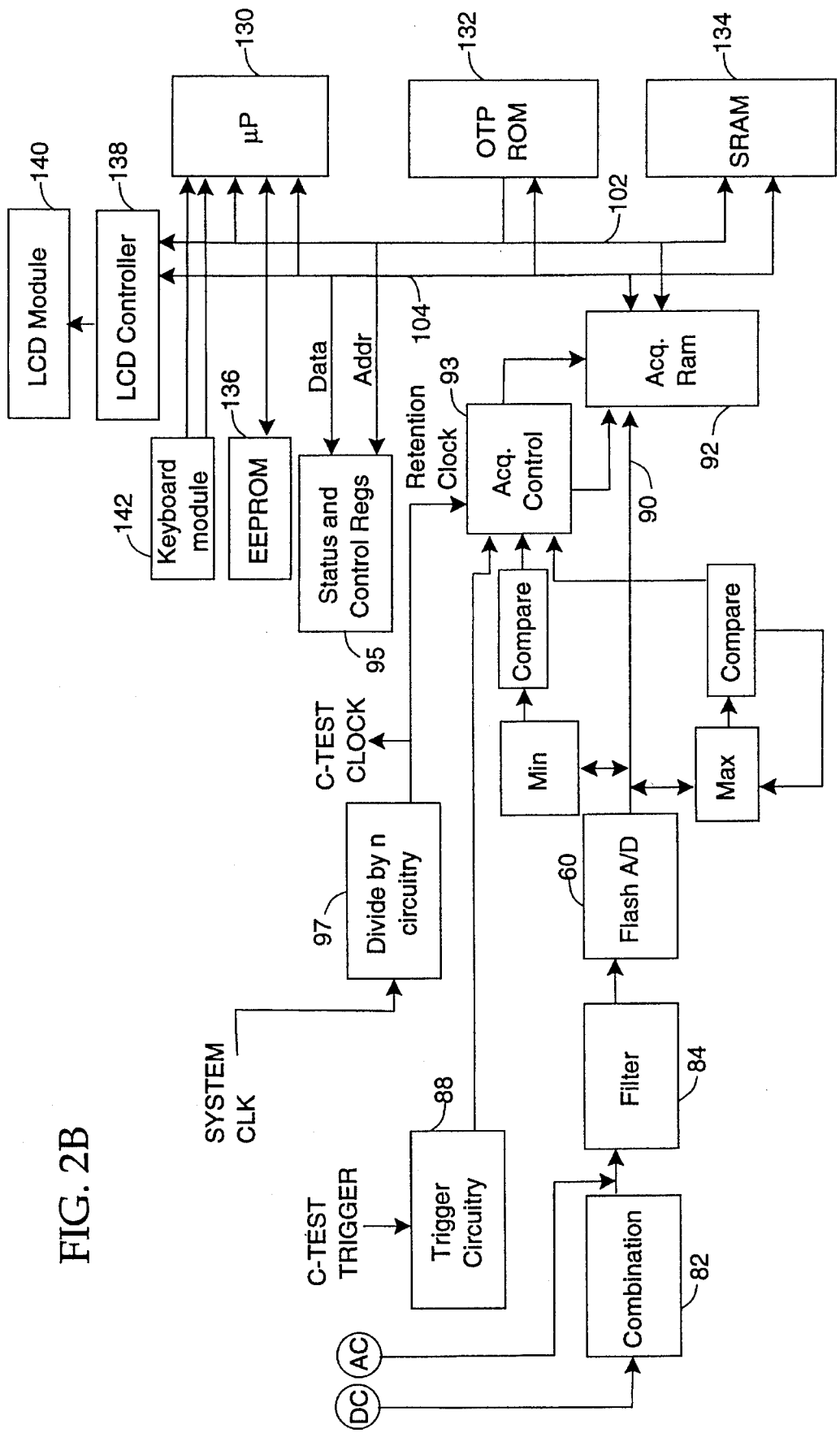

FIGS. 2A–2B together form a general block diagram of a test instrument that embodies aspects of the present invention. The test instrument is similar in several of its functions to a known digital multimeter. For example, the instrument can be used to measure voltage, current or impedance as explained below. Additionally, it incorporates new features, circuits and methods of operation, as explained below, directed specifically to component testing. Since the component test aspects are interrelated with the overall system apparatus and operation, the instrument is described generally at the outset. The instrument generally comprises a front end, a data acquisition section, a control/memory section and a display section, each of which is described in turn as follows.

Front End Section

Referring to FIG. 2A, the "front end" section of the test instrument includes a pair of terminals 36, 40 for coupling a device under test (DUT) to the instrument via appropriate test leads or probes (not shown), as is conventional. For example, to measure AC or DC voltage, one lead is connected to a selected circuit node or DUT and a second lead is connected between terminal 40 and circuit ground or the opposite side of the DUT. For DC voltage measurement, the input voltage presented at terminal 36 passes through a protection circuitry 34 (via either high voltage or low voltage path) to a DC input attenuation circuit 62. When the instrument is set to operate as a DC voltage meter, the attenuated DC input signal passes through a DC filter 64 and a multiplexer 66 to an analog-to-digital converter A/D 68 for conversion into digital form. Display of the results is discussed later.

For AC measurements, the input signal originating at terminal 36 is routed through protection circuit 34 to an AC input attenuation circuit 70. The output of attenuation circuit 70 is coupled through an RMS converter 72 into the multiplexer 66. During AC meter operations, multiplexer 66 couples the RMS AC signal to the A/D converter 68. For current measurements, one or more additional terminals, e.g. terminal 76 (rather than the common terminal 40), is used for connecting the second lead to current switching circuitry 52. Further description of input attenuation and of meter operations is omitted as such is unnecessary to understanding the present invention. The front end also includes a component test source circuit 80 for providing test stimulus waveforms as described in detail later.

Test Stimulus Waveform

The component test source 80 of FIG. 2A contains circuitry for digitally synthesizing a desired test waveform such as a sinewave. Appropriate values for forming the desired waveform may be stored for example in a memory or generated using combinatorial logic. The test source 80 receives a C-TEST CLOCK signal (FIG. 2B) and responsive to each cycle of the C-TEST CLOCK signal, generates the next one of the series of predetermined values for forming the waveform. In a currently preferred embodiment, 64 predetermined values defining one quadrant of a sinewave are produced. Level shifting and a digital complementor circuit are used for assembling the four quadrants so as to form a complete sinewave comprising 256 data points. These values are converted from digital form to analog voltage levels and output at node 81. The component test source 80 also provides the C-TEST TRIGGER signal which is asserted at the beginning of each cycle of the stimulus waveform.

Data Acquisition Section

The Data Acquisition Section is described next with emphasis on aspects pertinent to component testing. When the test instrument is switched to the component testing function, a component test source circuitry 80 is activated to provide a periodic test stimulus signal. The stimulus signal is output through protection circuit 34 to a DUT (not shown) through terminal 36. During a voltage scan (further described below), terminal 36 is coupled through the protection circuit 34 to the DC input attenuation circuit 62 for measuring voltage at the terminal. The output of attenuation circuit 62, labeled "DC", is coupled to a combination circuit 82 (see FIG. 2B ). From the combination circuit 82, the DC signal is input to a filter circuit 84. AC input voltage or signals pass through the protection circuit 34 to the AC input attenuation circuit 70 (FIG. 2A), the output of which, labeled "AC", is coupled to the filter circuit 84 (FIG. 2B). The combination circuit 82 and filter circuit 84 thus recombine the AC and DC voltage components of the terminal signal, and the combined signal is input to a flash A/D converter 60 for conversion to digital form. The flash A/D is driven by a relatively fast clock, further described below. The resulting digital values are transmitted over a data bus 90 for storage in an acquisition memory 92, also further described below.

Component testing also includes acquiring current measurement data as follows. During component test mode, common terminal 40 is coupled to a component test current-to-voltage conversion circuit 42. The resulting voltage (representing current) is coupled to both the DC input attenuation circuit 62 and the AC input attenuation circuit 70. In alternative embodiment, these voltages may be routed through the protection circuit 34 to the attenuation circuits. (It should be noted here that voltage and current measurements are not conducted simultaneously. Thus, portions of the front end are used for both functions.) The DC and the AC voltage signals then are combined, filtered and converted to digital form as described above in the case of component test voltage measurements. The resulting digital current data also is provided over data bus 90 for storage in the acquisition RAM 92. Acquisition RAM 92 is a random access memory having a total size, in the currently preferred embodiment, of 512 by 8 bits. Operation of the data acquisition section is described in greater detail below in part III.

Control, Memory and Display Section

Referring to FIG. 2B, a microprocessor 130 is coupled to an address bus 102 and a data bus 104. The acquisition RAM 92 also is coupled to the address and data buses. Under control of the microprocessor 130 and appropriate software, scan data temporarily stored in the acquisition RAM 92 is transferred over data bus 104 to a system memory SRAM 134. The address and data buses also are coupled to a status and control registers 95, EEPROM 136 and read-only memory (ROM) 132. The EEPROM is used to store calibration data, user defaults, stimulus waveform selection data and configuration data, while the ROM is used for storing software further described below. The common address and data buses 102, 104 also are coupled to a LCD (liquid crystal display) controller 138 for displaying stored data on a LCD module 140 described next.

In a preferred embodiment, a graphical display is provided by a liquid-crystal display device, a variety of which are commercially available. LCD have the advantages of ruggedness, low cost and low power requirements versus other display technologies. However, any pixel-addressable display means can be used. An LCD suitable for the present application may be transflective or reflective and optionally may be backlit. In one commercial embodiment of the invention in a portable test instrument, an LCD module 140 has a total of 200 pixels (vertical) by 240 pixels (horizontal). Only 128 pixels vertically are used for a graphical display such as a Lissajous pattern (vertical corresponds to volts). Accordingly, only the 7 most significant bits (msb) of data are used. This leaves space for display of other text or numeric information such as meter operating mode, scaling, etc. above or below the graphical portion of the display. As for the horizontal display, 256 levels (8 bits) are stored. In practice, however, the 240 horizontal pixels are adequate as the data does not reach full scale. The display is centered over approximately 80 percent of full scale. Thus, the graphical portion of the display measures 128 high by 180 pixels wide. A graphical portion of the display 24 shows a Lissajous pattern formed as described above. Other features of the display are described later.

III. COMPONENT TEST OPERATION

Continuous Data Acquisition

In operation, when the instrument is switched to the component test mode of operation, the component test stimulus waveform generator described above is activated (by the control microprocessor 130) so that it continuously generates a periodic stimulus waveform such as a sinewave. The stimulus waveform is applied to the DUT as described above. Measurement data is acquired continuously through the hardware as described above. The acquisition control circuit 93 controls acquisition RAM 92 so as to write a data point into the RAM on each cycle of the retention clock signal, which is provided to the control circuit by a divide-by-n circuit 97 (FIG. 2B). In the currently preferred embodiment, 256 data points are acquired over each cycle of the test stimulus waveform. Note that the C-TEST CLOCK runs at 256 times the test waveform frequency. Accordingly, the retention clock and the C-TEST CLOCK in this case are the same. Divide-by-n circuit 97 receives a system clock signal having a frequency of, for example, 19.2 MHz, as provided by a crystal-based oscillator (not shown). Scan data are stored sequentially into the RAM 92, which is arranged as a circular buffer. Thus, new scan data overwrites previously stored data once the buffer is full. Buffering scan data is described more fully below.

Scan Triggering

Next, the microprocessor sets a flag (e.g. in status and control registers 95) to indicate start of a voltage scan. At the beginning of the next cycle of the test waveform, as indicated by C-TEST TRIGGER, a voltage scan begins. At that time, the current value of the acquisition RAM address pointer is stored in a register, so that it points to the start of the voltage scan data. Measurement data continues to be acquired and stored in the acquisition RAM for exactly one cycle of the test stimulus signal. This completes one scan— referred to as a voltage scan where voltage is being acquired. The acquired data comprises a series of 256 digital data words or values. Once 256 values have been acquired, storage in the RAM is stopped so that it is not overwritten. The microprocessor then moves the acquired scan data into SRAM 134. More specifically, the voltage scan data is moved into a temporary voltage scan buffer "Temp Voltage" 16 (FIG. 1).

After the voltage scan is completed, the front end circuitry is switched to acquire current data as described previously. The microprocessor then sets a flag to indicate start of a current scan. Again, data acquisition continues, with acquired current data being stored in RAM 92 in the same fashion as voltage data. At the beginning of the next cycle of the test stimulus waveform, when C-TEST TRIGGER is asserted, a current scan begins. The present value of the acquisition RAM address is stored as a start address for the current scan data. Acquired data is stored over one cycle, i.e. 256 data points as before. Subsequently, the stored current scan data is moved into SRAM 134. More specifically, the current scan data is moved into the temporary current scan buffer "Temp Current" 14 (FIG. 1). Note that both scans were triggered by exactly the same trigger point relative to the beginning of a cycle of the stimulus waveform. (It makes no difference if several cycles of the test waveform occurred between the voltage scan and the current scan.) As a result, the stored voltage and current scan data are "synchronized" with respect to the stimulus waveform, and therefore their phase relationship is maintained, just as if they had been acquired simultaneously. This feature is unique to the single-channel, direct digital synthesis component test technique disclosed in the application identified above.

The temporary voltage and current scan data stored in the SRAM can be processed for the LCD controller 138 for concurrent display so as to form a Lissajous pattern on the display module 140. All acquired data is not necessarily displayed, however. Rather, display of data is subject to the Hold function and validity checking as described next.

IV. SOFTWARE DESCRIPTION

FIG. 3 is a software state transition diagram illustrating operation of the system software in greater detail, and in particular with respect to validity checking. The diagram of FIG. 3 will be described in the following three cases: first, where the Hold function is off; second, where the Hold function is on and the test probes are continuously maintained in good contact with the component under test; and third, where Hold is on and a scan validity check detects an open circuit either initially or during the component test process.

(1) Test System Operation with Hold Function Off

Component test begins with transition 150 at the bottom of FIG. 3 entering a "Startup_state" 152, If Hold status is off, a transition 153 occurs to enter a "doing_volts" state 154. Transition 153 sets the scan type to VOLTAGE SCAN which sets up the acquisition hardware in preparation for voltage scan, and it sets a retrieve_scan_data flag equal to FALSE. In the doing_volts state 154, a voltage scan is performed as described previously. An interrupt from the A/D hardware (AtoD_data_interrupt="TRUE") signals the software that the voltage scan has completed.

After the voltage scan is completed, transition 155 occurs in which the scan type is set to CURRENT SCAN, to prepare the hardware to conduct a current scan, and "retrieve_scan_data" is set to "VOLTAGE". The latter step calls a software function to fetch the voltage scan data out of the acquisition RAM, identify it as voltage scan data and store it in a temporary voltage scan buffer (16 in FIG. 1). Next, a "doing_amps" state 156 performs a current scan. An A/D interrupt again signals that the scan is completed. Since Hold status is off, transition 158 applies. It sets scan type back to VOLTAGE SCAN, and software transitions back to the doing_volts state 154 for the next voltage scan. Transition 158 also sets retrieve_scan_data equal to CURRENT. This step calls a software function which fetches the current scan data from the acquisition RAM, identifies it as current scan data and moves it into the temporary current scan buffer (14 in FIG. 1 ). Next, the doing_volts state 154 again performs another voltage scan, as described above.

(2) Test System Operation with Hold Function On

Beginning again at the Startup_state 152, where touch_hold_status is ON, the software transition 160 sets flags as follows. Scan type is set to OPEN_LEAD_DETECT. This prepares the hardware for conducting an open lead check. Retrieve_scan_data is initialized to FALSE; update touch_hold readings is initialized to HOLD; first_pass is initialized to BAD; and scan_valid is initialized to TRUE. The purpose of each of these flags not previously discussed will become apparent.

Transition 160 enters a "doing_open_lead_check" state 162. In this state, the software performs an open lead check, which essentially comprises conducting a current scan. As before, an AtoD_data_interrupt signal indicates the completion of the current scan. Check_for_valid_scan= "TRUE" calls a function to examine the minimum and maximum values of the current scan data. A current value representing zero current indicates an open lead. The actual measurement value may not be exactly equal to zero, but if near zero, the leads are considered open.

In the next state, "checking_scan_integrity" state 166, if zero is not detected, scan_valid is set true. The next transition depends upon the value of the first_pass flag. Since it was initialized to BAD, the software follows transition 172, which includes setting retrieve_scan_data to FALSE and setting scan type to VOLTAGE SCAN. Since retrieve_scan_data is false, the display is on hold, i.e., the display is not updated. Software proceeds to enter the doing_volts state 154 to begin a voltage scan.

To summarize, when the component test starts up and Hold status is on, the software first conducts an open lead check, and if the leads are intact (current is not zero), it then begins the first voltage scan. After completion of the voltage scan, a current scan is conducted as described before. After completion of the current scan, since Hold status is ON, an open lead test is conducted. At this point, the acquired voltage and current scan data have been moved into temporary buffers as described before. Setting the first_pass flag to GOOD indicates that at least one valid scan has been done so the buffered data is made available for display.

Next, an open lead check 162 is performed, as described before, followed by the scan integrity check state 166. If the scan is valid, indicating that the probes are still making contact, software follows transition path 168 back to the doing_volts state 154 to commence the next voltage scan. In this way, the software repeatedly follows the loop formed by states 154, 156, 162 and 166, repeating voltage and current scans, and conducting a scan integrity check after each scan pair is acquired. The display is updated asynchronously, using the data provided to it by the buffer pointers.

(3) Test System Operation with Hold Function On and Open Lead Detected

Finally, we consider the case where Hold status is on, and the software has transitioned through at least one valid scan. This time, the checking_scan_integrity state 166 detects a zero current scan value and therefore sets scan_valid equal to FALSE. Consequently, transition 170 applies, to state 162 for another open lead check. On this transition, retrieve_scan_data is set to FALSE so that the last scan data pair is not fetched from the acquisition RAM. Also, first_pass is set to BAD to direct software flow over transition 172, if and when a good lead connection is re-established. Additionally, transition 170 sets update_touch_hold_readings to "HOLD" to indicate that the last scan data pair should not be used to update the display. Accordingly, referring to FIG. 1, the buffer data process 12 maintains the buffer pointers so that data stored at the "last valid display buffer" 20 is used for the display. As a result, the visual display holds the last valid display values before continuity was interrupted.

In state 162, another current scan is conducted, followed by the check for scan integrity, state 166. If zero current is detected again, control transitions 170 back to state 162. The software continues to loop in this fashion, transitioning between states 162 and 166, holding the present display values until lead contact is established. Once that happens, control transitions 172 to state 154 to commence a voltage scan as described above.

To summarize, the software state transition diagram described above shows how the test system, upon entering the component test mode, defers conducting voltage and current scans, until it first determines that the probes are properly in place. Additionally, the open lead check is conducted after each voltage/current scan pair is acquired. If an open lead is detected, the display holds the last known valid data and is not updated. Finally, a new voltage and current scan sequence is commenced if and when the open lead check confirms that the probes are properly in place.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. In a portable electronic test instrument having measurement circuitry for measuring selected parameters at an input terminal, a method of conducting a component test comprising the steps of:

providing a pixel-addressable display module for graphic display of measurement scan data;

receiving an indication that a component test mode is selected;

responsive to said indication, applying a predetermined, periodic test stimulus waveform to a device under test coupled to the input terminal;

at a predetermined time relative to a beginning of a first cycle of the stimulus waveform, acquiring a series of measurements of a first parameter so as to form first scan data;

after the first scan is completed, and at the predetermined time relative to a beginning of a second cycle of the stimulus waveform, acquiring a series of measurements of a second parameter so as to form second scan data having a defined phase relationship relative to the first scan;

after the second scan is completed, checking continuity for detecting and indicating an open circuit at the input terminal; and if the open circuit is not detected, updating the display module responsive to the first and second scan data.

2. A method according to claim 1 further comprising:

providing a Hold function available for selection by a user;

if the Hold function is not enabled, updating the display module responsive to the first and second scan data without regard to the indication of a open circuit.

3. A method according to claim 1 wherein:

the first scan is a voltage scan conducted over one cycle of the stimulus waveform;

the second scan is a current scan conducted over one cycle of the stimulus waveform; and said updating the display includes concurrently displaying the voltage and current scan data so that the graphic display forms a Lissajous-type pattern.

4. A method according to claim 1 further comprising the steps of:

providing a Hold function available for selection by a user;

if the Hold function is enabled, checking continuity for detecting and indicating an open circuit at the input terminal before commencing the said first scan; and, only if an open circuit is not indicated, then commencing the said first scan, thereby deferring the component test if an open circuit exists at the input terminal.

5. A method according to claim 4 further comprising, if the Hold function is enabled and an open circuit is detected, repeating said checking continuity step until an open circuit is not detected, and then commencing said acquiring measurements to form scan data, so that said acquiring measurements is deferred after continuity is established at the input terminal.

6. A method according to claim 4 further comprising:

storing the scan data;

checking continuity to determine whether the stored scan data is valid; and providing the stored scan data for updating the display only if an open circuit is not detected, thereby displaying only valid scan data.

7. In a portable electronic test instrument having measurement circuitry for measuring selected parameters at an input terminal, a method of conducting a component test comprising the steps of:

providing a pixel-addressable display module for graphic display of measurement scan data;

receiving an indication that a component test mode is selected;

responsive to said indication, applying a predetermined, periodic test stimulus waveform to a device under test coupled to the input terminal;

if the leads are intact (current is not zero), beginning a first voltage scan to acquired voltage scan data;

after completion of the first voltage scan, conducting a current scan to acquire current scan data;

after completion of the first current scan, moving the acquired voltage scan and current scan data into temporary buffers;

then checking for an open lead;

providing buffer pointers into the temporary buffers for updating a display responsive to the acquired voltage and current scan data;

repeating said checking for an open lead;

if an open lead is not detected, repeating said conducting a voltage scan and said conducting a current scan so as to form a new scan data pair;

moving the new scan data pair into the temporary buffers; and repeating the foregoing series of steps so that an open lead check is conducted after each scan data pair is acquired.

8. A method according to claim 7 further comprising:

if an open lead is detected, displaying the last known valid data.

9. A method according to claim 8 wherein said checking continuity includes conducting a validity current scan and examining the validity current scan data to detect a substantially zero value, thereby indicating an open circuit.

10. A test instrument comprising:

means for generating a periodic test stimulus waveform;

means for applying the test stimulus waveform to a DUT;

a single-channel input means coupled to the DUT for performing one at a time of a voltage scan and a current scan to acquire voltage and current scan data, respectively;

a temporary voltage scan data buffer for holding acquired voltage scan data;

a temporary current scan data buffer for holding acquired current scan data;

a set of new display buffers for holding valid voltage and current scan data;

display means having access to the new display buffers for displaying the valid voltage and current scan data together so as to form a Lissajous-type pattern;

means for controlling the input means so as to perform a validity check current scan to detect an open lead; and means for moving voltage and current scan data from the temporary data buffers into the new display buffers for display after completion of the validity check if an open lead is not detected.

* * * * *